(12) United States Patent
Smith et al.

(10) Patent No.: US 6,847,525 B1
(45) Date of Patent: Jan. 25, 2005

(54) FORCED CONVECTION HEAT SINK SYSTEM WITH FLUID VECTOR CONTROL

(75) Inventors: Grant M. Smith, Bryn Athyn, PA (US); Mark W. Wessel, Bala Cynwyd, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/155,266

(22) Filed: May 24, 2002

(51) Int. Cl.[7] ................................................. H05K 7/20
(52) U.S. Cl. .................... 361/703; 361/689; 361/690; 361/719; 174/16.1; 174/16.3; 165/80.3
(58) Field of Search ................ 361/589–695, 361/697, 707, 709, 704, 699, 700, 710, 719, 720; 257/722, 706, 721; 174/16.1, 16.3, 15.1, 15.2; 165/80.3, 185, 80.4, 104.33

(56) References Cited

U.S. PATENT DOCUMENTS

| | | | | | |
|---|---|---|---|---|---|
| 4,753,290 A | * | 6/1988 | Gabuzda | ..................... | 165/185 |
| 5,002,123 A | * | 3/1991 | Nelson et al. | .............. | 165/147 |
| 5,523,918 A | * | 6/1996 | Chiou | ......................... | 361/695 |
| 5,597,034 A | * | 1/1997 | Barker et al. | .............. | 165/80.3 |
| 5,740,013 A | * | 4/1998 | Roesner et al. | ............. | 361/697 |
| 5,910,694 A | * | 6/1999 | Yokozawa et al. | ............ | 310/89 |
| 6,015,008 A | * | 1/2000 | Kogure et al. | .............. | 165/185 |
| 6,111,748 A | * | 8/2000 | Bhatia | ........................ | 361/695 |
| 6,157,104 A | * | 12/2000 | Yokozawa et al. | ............ | 310/58 |
| 6,172,416 B1 | * | 1/2001 | Miyahara et al. | ........... | 257/712 |
| 6,179,046 B1 | * | 1/2001 | Hwang et al. | ............. | 165/80.3 |
| 6,234,239 B1 | * | 5/2001 | Azar | ........................ | 165/80.3 |
| 6,266,243 B1 | * | 7/2001 | Tomioka | ..................... | 361/695 |
| 6,288,895 B1 | * | 9/2001 | Bhatia | ........................ | 361/687 |
| 6,301,115 B1 | * | 10/2001 | Hashimoto et al. | ......... | 361/704 |
| 6,313,399 B1 | * | 11/2001 | Suntio et al. | ........... | 174/17 VA |
| 6,364,009 B1 | * | 4/2002 | MacManus et al. | ........ | 165/185 |
| 6,421,239 B1 | * | 7/2002 | Huang | ........................ | 361/696 |
| 6,446,707 B1 | * | 9/2002 | White | ........................ | 165/80.3 |
| 6,595,275 B1 | * | 7/2003 | Wang et al. | ................ | 165/185 |
| 6,668,910 B2 | * | 12/2003 | Gawve | ...................... | 165/80.3 |
| 6,698,511 B2 | * | 3/2004 | DiBene et al. | .............. | 165/185 |

* cited by examiner

Primary Examiner—Boris Chérvinsky
(74) Attorney, Agent, or Firm—Lise A. Rode; Mark T. Starr; RatnerPrestia

(57) ABSTRACT

A heat sink is provided for transferring heat to air flowing from an upstream path. The heat sink includes a support portion and a plurality of fins extending from the support portion. The fins and the support portion together define channels at least one of which has a portion angled with respect to the upstream path of flowing air. Redirection of the flowing air from the upstream path to at least one downstream path is thereby facilitated.

10 Claims, 5 Drawing Sheets

FORCED CONVECTION HEAT SINK SYSTEM WITH FLUID VECTOR CONTROL

FIELD OF THE INVENTION

This invention relates to a heat sink for transferring heat to air flowing through an electronic system. More particularly, this invention relates to a forced convection heat sink system with fluid vector control.

BACKGROUND OF THE INVENTION

This invention addresses the problems associated with the dissipation of heat from heat-generating components of an electronic system. As the mechanical packaging efforts of the electronics industry push relentlessly toward smaller and smaller products, the demands for thermal efficiency increase. Often, elaborate air flow schemes, ducting, and dissipative component placement are found desirable to achieve target temperature levels within electronic systems. Accordingly, improvements with respect to thermal efficiency and cooling are pursued. Positive, high velocity air flow is often desired for the effective cooling of one or more electronic components, and a heat sink is often used in connection with such components to increase or optimize heat dissipation. Such heat sinks, however, can in certain situations diffuse the cooling air flow, decrease the velocity of air flow, increase the pressure drop of air flow, and/or cause turbulent air flow. Each of these effects, alone or in combination, can result in a decrease in heat sink performance. Accordingly, there remains a need for optimization of the cooling effect of cooling air flow in electronic systems such as those having a directional air flow environment. Ideally, such cooling is achieved without increasing material mass, adding extraneous components or features, or otherwise complicating the system.

SUMMARY OF THE INVENTION

According to an exemplary embodiment of this invention a heat sink is provided for transferring heat to air flowing from an upstream path. The heat sink includes a support portion and a plurality of fins extending from the support portion. The fins and the support portion together define channels, at least one of which has a portion angled with respect to the upstream path of flowing air. Redirection of the flowing air from the upstream path to at least one downstream path is thereby facilitated.

According to another exemplary aspect of this invention, an electronic system adapted for heat dissipation is provided. The electronic system includes a heat sink positioned to transfer heat to air flowing from an upstream path, wherein the heat sink includes a support portion and a plurality of fins extending therefrom. The fins and the support portion together define a channel having a portion angled with respect to the upstream path of flowing air. Redirection of the flowing air from the upstream path to a downstream path is thereby facilitated. The electronic system also includes a component positioned along the downstream path for heat dissipation by the redirected flowing air.

According to yet another exemplary aspect of this invention, a method is provided for dissipating heat from components of an electronic system. The method includes flowing air along an upstream path and toward a heat sink defining a channel having a portion angled with respect to the upstream path. The flowing air is redirected, by means of the channel of the heat sink, from the upstream path to a downstream path. Heat is dissipated from one or more components positioned along the downstream path.

BRIEF DESCRIPTION OF THE DRAWINGS

Exemplary embodiments of this invention will be described with reference to the drawing, of which.

DETAILED DESCRIPTION OF THE INVENTION

Figure 1:
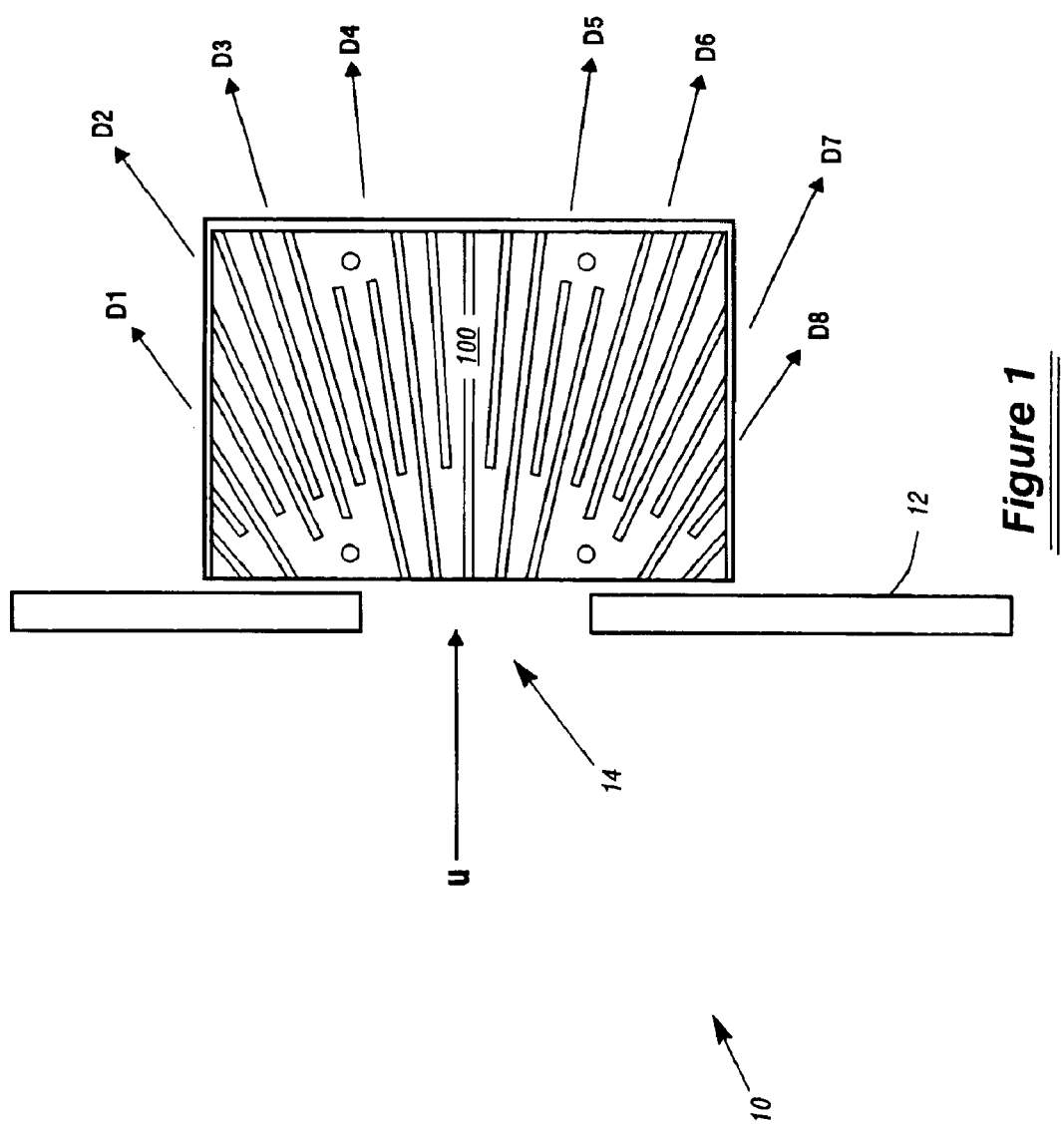
FIG. 1 is a top view of an embodiment of an electronic system according to exemplary aspects of this invention.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Referring to the figures generally, a heat sink 100 or 200 is provided for transferring heat to air flowing from an upstream path "U." The heat sink 100 or 200 includes a support portion 102 or 202, respectively, and a plurality of fins 104 or 204, respectively, extending from the support portion 102 or 202. The fins 104 or 204 and the support portion 102 or 202 together define channels 106 or 206, at least one of which has a portion angled with respect to the upstream path of flowing air "U." A redirection of the flowing air from the upstream path "U" to at least one downstream path "D" is thereby facilitated.

According to another aspect of this invention, an electronic system 10 or 300 adapted for heat dissipation is provided. The electronic system 10 or 300 includes a heat sink 100 or 200 positioned to transfer heat to air flowing from an upstream path "U" or "U1–U6" wherein the heat sink 100 or 200 includes a support portion 102 or 202 and a plurality of fins 104 or 204 extending therefrom. The fins 104 or 204 and the support portion 102 or 202 together define a channel 106 or 206 having a portion angled with respect to the upstream path of flowing air "U." Redirection of the flowing air from the upstream path "U" to a downstream path "D" is thereby facilitated. The electronic system 10 also includes a component 400A–400D positioned along the downstream path "D" for heat dissipation by the redirected flowing air.

In use according to a method for dissipating heat from components of an electronic system such as system 10 or 300, air is flowed along an upstream path "U" and toward a heat sink 100 or 200 defining a channel 106 or 206 having a portion angled with respect to the upstream path "U." The flowing air is redirected, by means of the channel 106 or 206 of the heat sink 100 or 200, from the upstream path "U" to a downstream path "D." Heat is dissipated from one or more components 400A–400D positioned along one or more downstream path.

Exemplary features of selected embodiments of the invention will now be described with specific reference to FIGS. 1–5. Referring first to FIG. 1, an electronic system 10 is illustrated. The electronic system 10 is cooled at least in part by cooling air flowing along an inlet air direction or upstream path "U." The cooling air flows toward an aperture 14, such as a restricted air inlet, defined by a structure of the electronic system 10. For example, aperture 14 may be defined by a chassis component, a circuit board, a midplane, or some other component of the electronic system 10 that at least partially traverses the path of cooling air flow. Despite the fact that it may define an aperture 14 through which cooling air can flow, a structure such as a circuit board 12 tends to restrict cooling air flow and reduces the area of the passage through which such cooling air flows. In addition to the restriction of the flow of cooling air, a structure such as a circuit board 12 may tend to block the flow of cooling air in such a way that it would not reach components of the electronic system 10 positioned behind the circuit board 12. In other words, except at the location of aperture 14, a circuit board 12 or other such component can create "blind" spots for the cooling air flow.

Electronic system 10 includes a heat sink 100 that reduces the effect of blocked air flow. Generally, it has been discovered that the effect of a cooling air stream can be optimized by combining the heat dissipation function of a heat sink with the effects of directing, smoothing, and controlling the inlet and outlet path, velocity and/or direction of the cooling air flow. Such a heat sink can be used in any application in which forced convection-type cooling is used and where the directional control of the cooling air is desirable.

As is illustrated in FIG. 1, the inlet air to the heat sink 100 is restricted to a smaller opening. In such an electronic system 10, however, the heat sink exit air should ideally be distributed to components that do not lie directly in the path of the natural path of the air. Thus, it has been discovered that the heat sink 100 can be provided with angled fins 104 which serve to redirect, bend, or otherwise shift the air flow in desired directions. Accordingly, allowance is made for the desired cooling effect on the heat-generating component beneath the heat sink, the cooling of various other system components, the accommodation of a minimized air inlet area, and a change in the air flow direction without the need for extraneous directional devices or air inlets.

It will be appreciated that the invention is not limited to the particular inlet/outlet scheme illustrated in the figures. Other variations of this invention could of course include a radially spreading pattern of any pitch, number of fins, and degree. Also, as will be discussed in greater detail subsequently, a patterned heat sink could also be used to direct inlet air from a larger, unobstructed space, and funnel the inlet air into a smaller exit area. Such heat sinks could also be configured so as to direct flowing air in any arcuate pattern or combination of patterns. In some circumstances, a heat sink according to this invention can eliminate the need for the combination of a heat sink with specialized ducting including applications where ducting may be needed to route the flow of air to a critical area or component of a system.

As is illustrated in FIG. 1, the heat sink 100 is positioned downstream from the aperture 14, thereby receiving cooling air flow from upstream path "U." The heat sink 100 is configured to redirect the upstream path "U" into one or more outlet directions or downstream paths "D1–D8."

Figure 2:
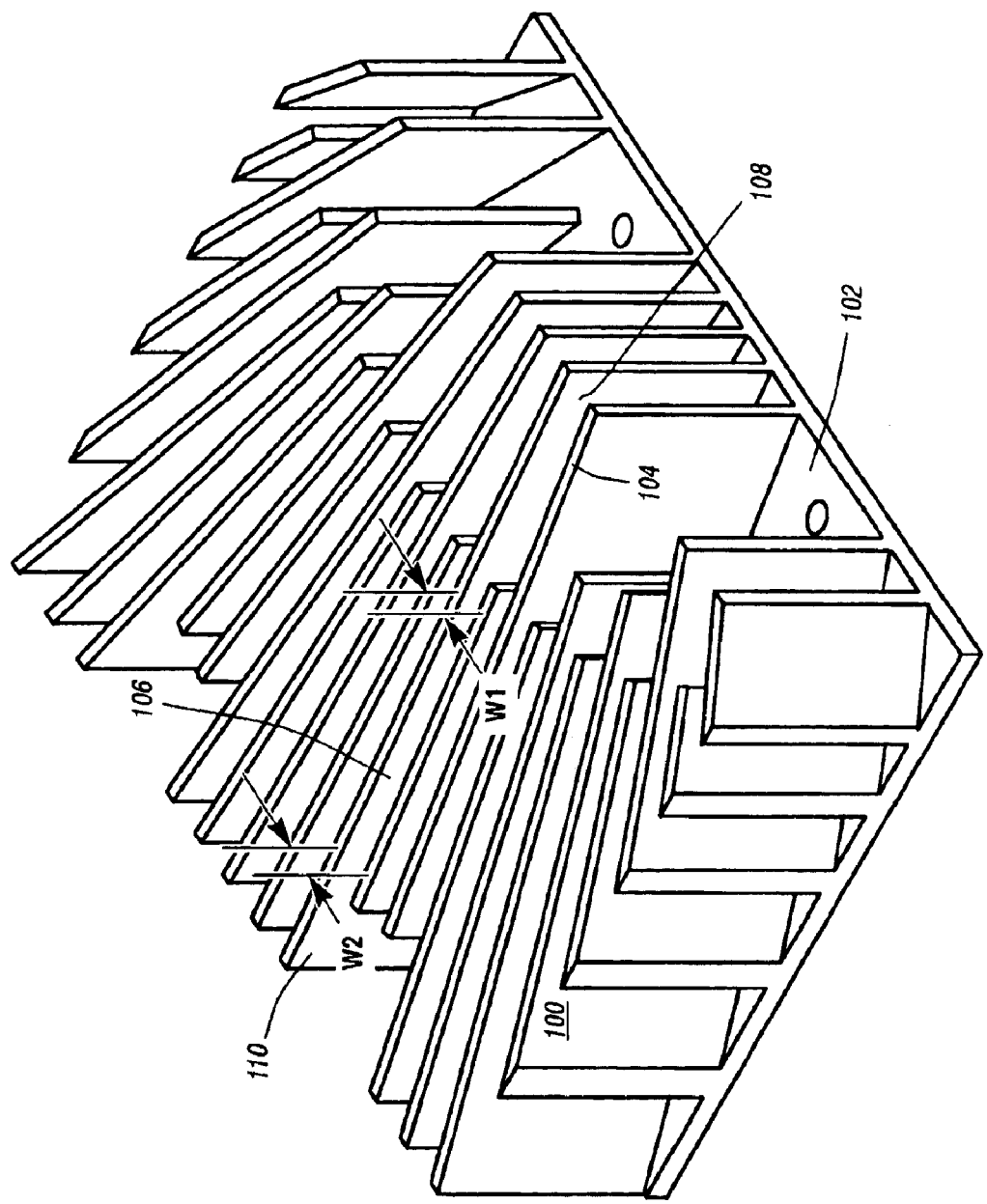
FIG. 2 is a top perspective view of an exemplary embodiment of a heat sink component of the electronic system shown in FIG. 1.

Referring to FIG. 2, which illustrates an exemplary embodiment of a heat sink according to aspects of this invention, heat sink 100 includes a support portion 102 with a plurality of fins 104 extending upwardly from the support portion 102. In this exemplary embodiment, the heat sink 100 is a one-piece component that may be formed from any conductive material. For example, the heat sink 100 may be formed from an aluminum casting. Similarly, the heat sink 100 may be formed from copper or other metallic or non-metallic materials. Other materials and forming techniques are contemplated as well.

The fins 104 and the support portion 102 together define a plurality of channels 106. Each of the channels 106 can be considered to have an upstream end 108 that receives cooling air flow and a downstream end 110 from which the air flow is discharged. As the cooling air flow passes through the channels 106 of the heat sink 100, heat is dissipated from the heat sink 100 by means of thermoconvective heat transfer, through which heat is transferred from the surfaces of the heat sink 100 to the air flowing adjacent those surfaces.

As is illustrated in FIG. 2, the channels 106 of heat sink 100 will have an upstream width "W1" and a downstream width "W2." By virtue of a difference between upstream width "W1" and downstream width "W2," or by virtue of any other dimensional change, the size of the channels 106 at the upstream end 108 can differ from the size of the channel 106 at the downstream end 110. Similarly, the size (or width or other dimensions) can change along the length of the channel 106 at any location at or between the upstream and downstream ends 108 and 110.

Figure 3:
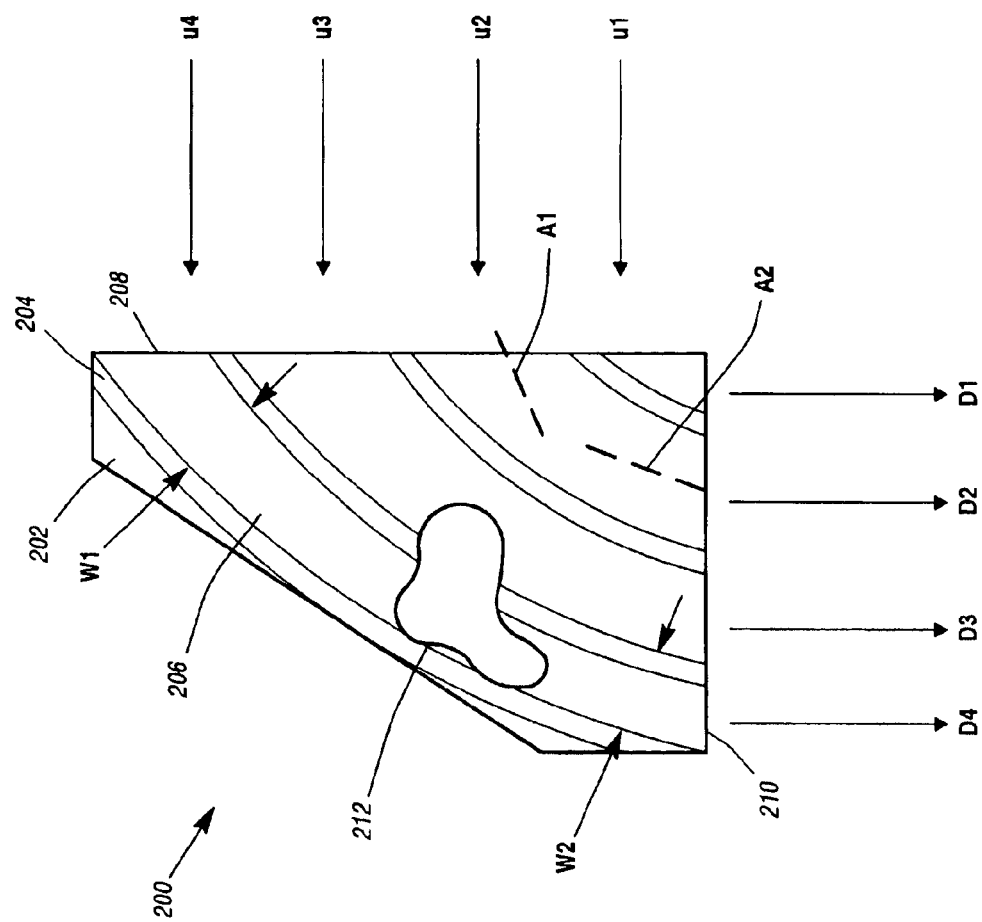
FIG. 3 is a top view of an exemplary embodiment of a heat sink assembly according to exemplary aspects of this invention.
Figure 4:
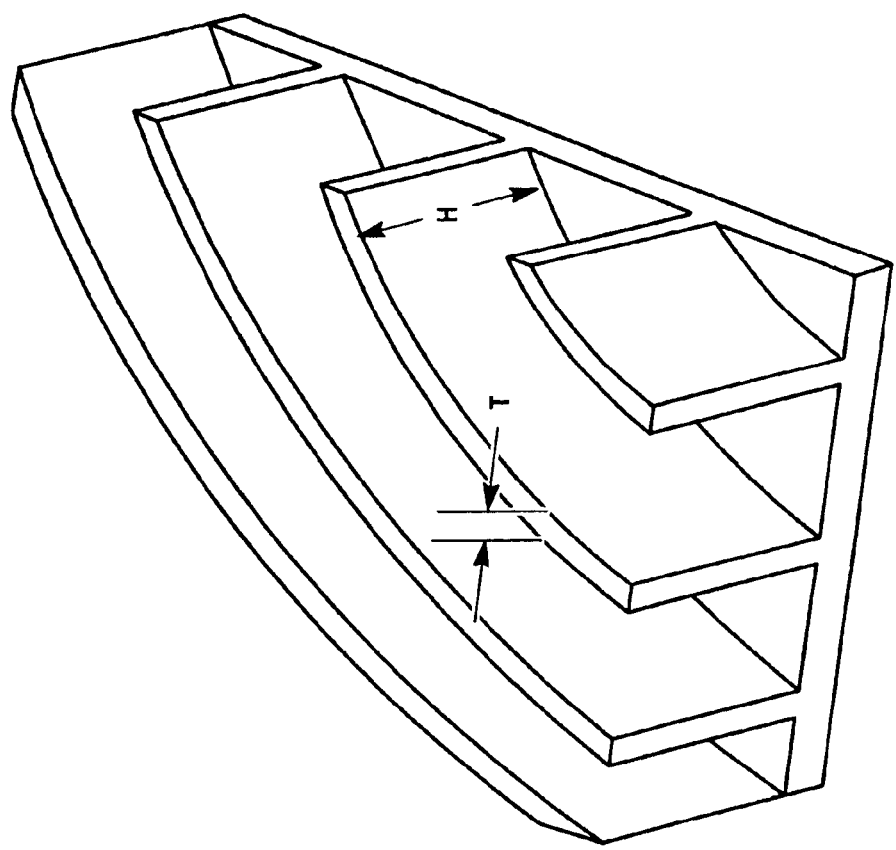
FIG. 4 is a top perspective view of an embodiment of a heat sink component of the heat sink assembly shown in FIG. 3.

Referring now to FIGS. 3 and 4, another exemplary embodiment of a heat sink assembly according to aspects of this invention is illustrated. The heat sink assembly illustrated in FIG. 3 includes a heat sink 200 mounted adjacent a cooled component 212 (shown by a break-away view of FIG. 3). Generally, heat sink 200 is configured to redirect inlet air directions or upstream paths "U1–U4" in such a way as to produce outlet flow directions or downstream paths "D1–D4." In this manner, heat sink 200 facilitates the dissipation of heat from the cooled component 212 by virtue of convection heat transfer is from the surfaces of the heat sink 200 to the cooling air flowing adjacent those surfaces.

Heat sink 200 includes a support portion 202 and a plurality of fins 204 extending from the support portion 202. The fins 204 and support portion 202 together define a plurality of channels 206 through which the cooling air flows. In this exemplary embodiment, it would be seen that the channels 206 include a curved portion or a continuous curve between an upstream end 208 and a downstream end 210. The channels 206 have an upstream width "W1" and a downstream width "W2." The upstream width "W1" and the downstream width "W2" can be constant along the length of the channel 206 between the upstream and the downstream ends 208 and 210. Alternatively, the width of the channel 206 can vary or fluctuate at one or more locations at or between the upstream and downstream ends 208 and 210. For example, if it is desired to focus the path of air flow, the width or size of the channel may decrease toward its downstream end 210. Conversely, an Increase in size or width or other dimensions would cause a divergence of the flow path.

Still referring to FIG. 3, it would be seen that the channel 206 includes an upstream axis "A1" toward the upstream end 208 of the channel 206. The upstream axis "A1" corresponds to the axis of the channel 206 as well as the direction of air flow through that portion of the channel 206. The channel 206 also includes a downstream axis "A2" at a location toward the downstream end 210 of the channel 206. The downstream axis "A2" corresponds to the axis of the channel as well as the direction of air flow at that location of the channel 206. Accordingly, a channel 206 may have axes at different locations along the length of the channel 206, and those axes may be oriented at an angle with respect to one another.

Referring specifically to FIG. 4, each of the fins 204 of the heat sink 200 has a height "H" and a thickness "T." Although the height "H" is illustrated to be substantially constant along the length of each fin 204 in FIG. 4, the height "H" can vary along the length of the fin 204. Also, the height of adjacent fins 204 can differ with respect to one another. Similarly, the thickness "T" of each fin 204 may be constant along the length of the fin 204, or may vary along the length or along the height of the fin 204. Also, the thickness "T" of one fin 204 may differ from that of one or more other fins 204.

Figure 5:
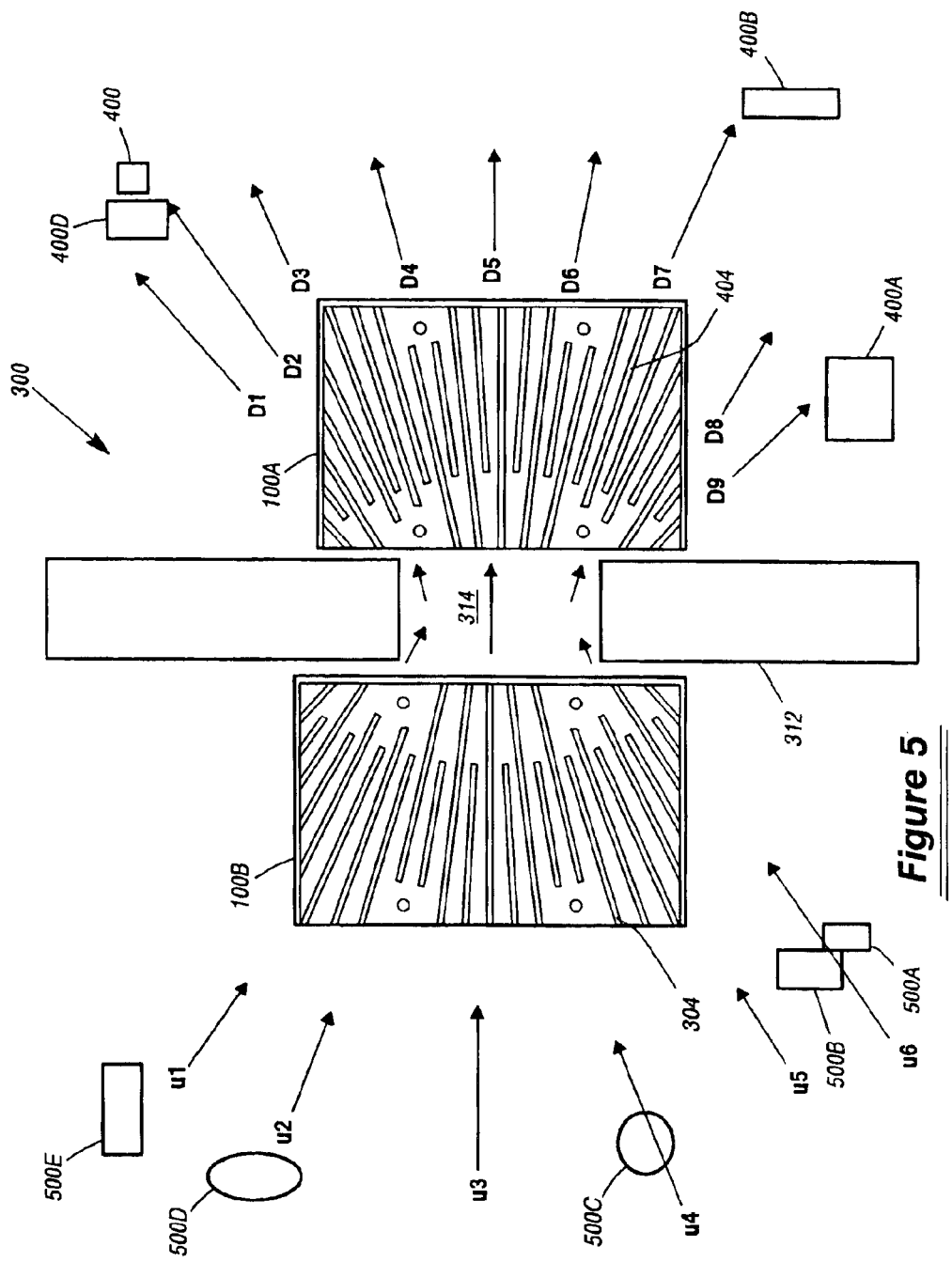
FIG. 5 is a top view of another exemplary embodiment of an electronic system according to exemplary aspects of this invention.

Referring now to FIG. 5, another exemplary embodiment of an electronic system according to aspects of this invention is illustrated. Generally, the electronic system 300 is adapted to accommodate the flow of cooling air through an aperture 314 in a circuit board 312 or other structure of the electronic system 300. In order to help optimize the effect of the cooling air, the electronic system 300 is provided with a downstream heat sink 100A and an upstream heat sink 100B. The fins 304 of the upstream heat sink 100B are oriented to redirect the flow of cooling air for flow through the aperture 314, and the fins 404 of downstream heat sink 100A are oriented to disperse the flow of cooling air received from the aperture 314.

More specifically, electronic system 300 includes a plurality of upstream components 500A–500E which are cooled by virtue of air flowing along upstream paths "U1–U6." By virtue of the upstream heat sink 100B, the air flowing along upstream paths "U1–U6" is focused or concentrated or otherwise redirected for flow through the aperture 314. The downstream heat sink 100A disperses the focused or concentrated air flow along one or more downstream paths "D1–D9." A series of downstream components 400A–400D are positioned along the downstream paths "D1–D9" for cooling purposes.

The arrows shown in FIG. 5 indicate the general air flow pattern in a system with restrictive air flow pathways. The heat sinks 100A and 100B help to control and direct the air from outer heated components, through a small or restrictive air passage, and radiate out again to facilitate the cooling of downstream components.

Many variations and modifications are contemplated to the exemplary heat sinks and electronic systems selected for illustration in the figures. It would be appreciated that the heat sinks of this invention can be used in a wide variety of applications and can include numerous configurations. The fins can be provisioned, shaped, or oriented in a wide variety of manners in order to provide a desired redirection of air flow. Whether the fins of the heat sink are angled, bent, curved, and/or slanted or otherwise configured, is the heat sinks can be adapted to accomplish a dual purpose of dissipating heat from a component and directing air flow toward heat-generating components.

A heat sink according to this invention can be used on its own or in conjunction with other heat sinks. Also, the heat sinks according to this invention are beneficially used when mounted upstream or downstream from an aperture, yet the heat sinks are beneficially used in a substantially open configuration as well.

Although exemplary embodiments of this invention have been described, there are others that support the spirit of the invention and are therefore within the contemplated scope of the invention. Specifically, it will be understood that a wide variety of modifications can be made to the materials, dimensions, proportions, and structures of the forced convection heat sink system while still enjoying the benefits of this invention.

For example, the fins 104 and 204 illustrated in FIGS. 2 and 4 are configured in a vertical position with respect to the support portion 102 and 202. However, various configurations may be utilized. In other words, the fins 104 and 204 may be horizontally fixed with respect to the support portion 102 and 202, or they may be configured at any angle with respect to the support portion 102 and 202.

Similarly, the rectangular cross section of the fins 104 and 204 may be modified to accommodate various system needs or manufacturing processes. For example, fins with rounded edges or tapers may be more desirable for casting purposes than those with sharp edges.

Aspects of this invention have been described as a system add-on that is installed in an existing electronic system 10 and 300 to optimize the cooling effect of cooling air flow throughout the system 10 and 300. Alternatively, the heat sink 100 and 200 may be part of the original electronic system 10 and 300, either removably mounted or permanently mounted. It will be appreciated that other modifications can be made to the illustrated embodiments without departing from the scope of this invention, which is separately defined in the appended claims.

What is claimed:

1. An electronic system adapted for heat dissipation, said electronic system comprising:

a heat sink positioned to transfer heat to air flowing from an upstream path, said heat sink comprising a support portion and a plurality of fins extending there from, said fins and said support portion together defining a channel having a portion angled with respect to the upstream path of flowing air, thereby facilitating redirection of the flowing air from the upstream path;

said electronic system defining an aperture through which at least a portion of the flowing air passes, said heat sink being positioned closely adjacent to and upstream of said aperture, and said fins of said heat sink being configured to focus the path of the flowing air toward said aperture for flow there through.

2. An electronic system adapted for heat dissipation, said electronic system comprising:

a heat sink positioned to transfer heat to air flowing from an upstream path, said heat sink comprising a support portion and a plurality of fins extending there from, said fins and said support portion together defining a channel having a portion angled with respect to the upstream path of flowing air, thereby facilitating redirection of the flowing air from the upstream path;

said electronic system defining an aperture through which at least a portion of the flowing air passes, said heat sink being positioned closely adjacent to and downstream of said aperture, and said fins of said heat sink being configured to disburse air flowing from said aperture.

3. An electronic system adapted for heat dissipation, said electronic system defining an aperture through which flowing air passes, said electronic system comprising:

a circuit board assembly having a plurality of electronic components; and a heat sink positioned upstream of said aperture and a heat sink positioned downstream of said aperture, each of said heat sinks comprising a support portion and a plurality of fins extending there from, said fins and said support portion together defining a channel having a portion angled with respect to the upstream path of flowing air, thereby facilitating redirection of the flowing air from the upstream path to a downstream path generally adjacent said circuit board assembly, said fins of said upstream heat sink being configured to focus the path of the flowing air toward said aperture for flow there through, and said fins of said downstream heat sink being configured to disburse air flowing from said aperture;

wherein at least one of said components is positioned along said downstream path for heat dissipation by the redirected flowing air.

4. The electronic system of claim 3, said fins and said support portion together defining a plurality of channels, two or more of said channels having a portion angled with respect to the upstream path of flowing air.

5. The electronic system of claim 4, said channels facilitating redirection of the flowing air to two or more downstream paths.

6. The electronic system of claim 4, wherein axes of said channels are non-parallel.

7. A method for dissipating heat from components of an electronic system, said method comprising the steps of:

flowing air along an upstream path and toward an upstream edge portion of a heat sink having a substantially planar support portion and a plurality of fins defining a channel which extends from the upstream edge portion of the heat sink to a downstream edge portion of the heat sink, the channel having a portion angled with respect to the upstream path;

redirecting the flowing air, by means of the channel of the heat sink, from the upstream path to a downstream path;

preventing the flowing air at the downstream edge portion from flowing parallel to the flowing air at the upstream edge portion; and dissipating heat from one or more components positioned along the downstream path;

said flowing step comprising flowing air through an aperture defined by the electronic system, and said redirecting step comprising redirecting air flowing into or out from the aperture.

8. A method for dissipating heat from components of an electronic system, said method comprising the steps of:

flowing air along an upstream path toward a heat sink defining a channel having a portion angled with respect to the upstream path;

focusing, by means of the channel of the heat sink, the path of the flowing air from the upstream path toward an aperture closely adjacent to and downstream of the heat sink for flow there through; and dissipating heat from one or more components positioned downstream from the aperture.

9. A method for dissipating heat from components of an electronic system, said method comprising the steps of:

flowing air along an upstream path through an aperture defined by the electronic system and toward a heat sink closely adjacent to and downstream of the aperture, the heat sink defining a channel having a portion angled with respect to the upstream path;

disbursing, by means of the channel of the heat sink, air flowing from the aperture; and dissipating heat from one or more components positioned downstream from the heat sink.

10. A method for dissipating heat from components of an electronic system, said method comprising the steps of:

flowing air along an upstream path and toward an upstream edge portion of a heat sink having a substantially planar support portion and a plurality of fins defining a channel which extends from the upstream edge portion of the heat sink to a downstream edge portion of the heat sink, the channel having a portion angled with respect to the upstream path;

redirecting the flowing air, by means of the channel of the heat sink, from the upstream path to a downstream path;

preventing the flowing air at the downstream edge portion from flowing parallel to the flowing air at the upstream edge portion; and dissipating heat from one or more components positioned along the downstream path;

said flowing step comprising flowing air toward an aperture, a heat sink positioned upstream from the aperture, and a heat sink positioned downstream from the aperture, and said redirecting step comprising focusing the path of the flowing air, by means of the upstream heat sink, toward the aperture for flow there through and disbursing air flowing from the aperture by means of the downstream heat sink.

* * * * *